United States Patent [19]

Johnson et al.

[11] 4,099,324

[45] Jul. 11, 1978

[54] MECHANISM FOR FEEDING AND INSERTING PINS INTO CIRCUIT BOARD

[75] Inventors: David Leroy Johnson, Des Plaines; Chester Joseph Matusek, Hillside, both of Ill.

[73] Assignee: Motorola, Inc., Schaumburg, Ill.

[21] Appl. No.: 779,454

[22] Filed: Mar. 21, 1977

[51] Int. Cl.[2] .............................................. B23P 19/00
[52] U.S. Cl. ........................................ 29/739; 29/626; 29/759; 29/761; 29/785; 29/809; 221/234
[58] Field of Search ................ 29/818, 739, 626, 759, 29/761, 809, 741, 785, 786, 788, 787, 796; 214/1 BC, 1 BB, 1.4; 227/117, 118; 198/339, 485; 221/234

[56] References Cited

U.S. PATENT DOCUMENTS

| 2,092,786 | 9/1937 | Taylor | 29/785 X |
|---|---|---|---|
| 2,869,129 | 1/1959 | Rogers, Jr. | 29/739 X |
| 3,597,826 | 8/1971 | Shields | 29/785 X |
| 3,930,808 | 1/1976 | Miller et al. | 29/809 |
| 3,932,931 | 1/1976 | Wright | 29/739 X |
| 3,956,918 | 5/1976 | Rao | 29/761 X |
| 4,044,462 | 8/1977 | Anselmo | 29/809 |

*Primary Examiner*—Victor A. DiPalma
*Attorney, Agent, or Firm*—James W. Gillman; Sang Ki Lee; Rolland R. Hackbart

[57] ABSTRACT

A mechanism for sequentially feeding pins includes a collet having a longitudinal bore for feeding pins from one end to a second end, the second end holding the pins in position. The second end of the collet has at least one longitudinal slot contained therein, providing variations in the cross sectional area of the bore when the holding end of the collet is tightened around a pin. Pins are pushed through the center bore of the collet from a bottom feed point. Pins are positioned in an indexable disc having cutouts for containing the pins and delivering the pins one-by-one to the feed end of the collet bore. The disc cutouts are sequentially indexed by a ratchet and pawl mechanism. The collet can also be used to hold a pin for insertion into a hole in a printed circuit board and fastening of the pin to the printed circuit board by rolling over a portion of the pin with a punch, the punch being positioned coaxially with the collet bore.

8 Claims, 5 Drawing Figures

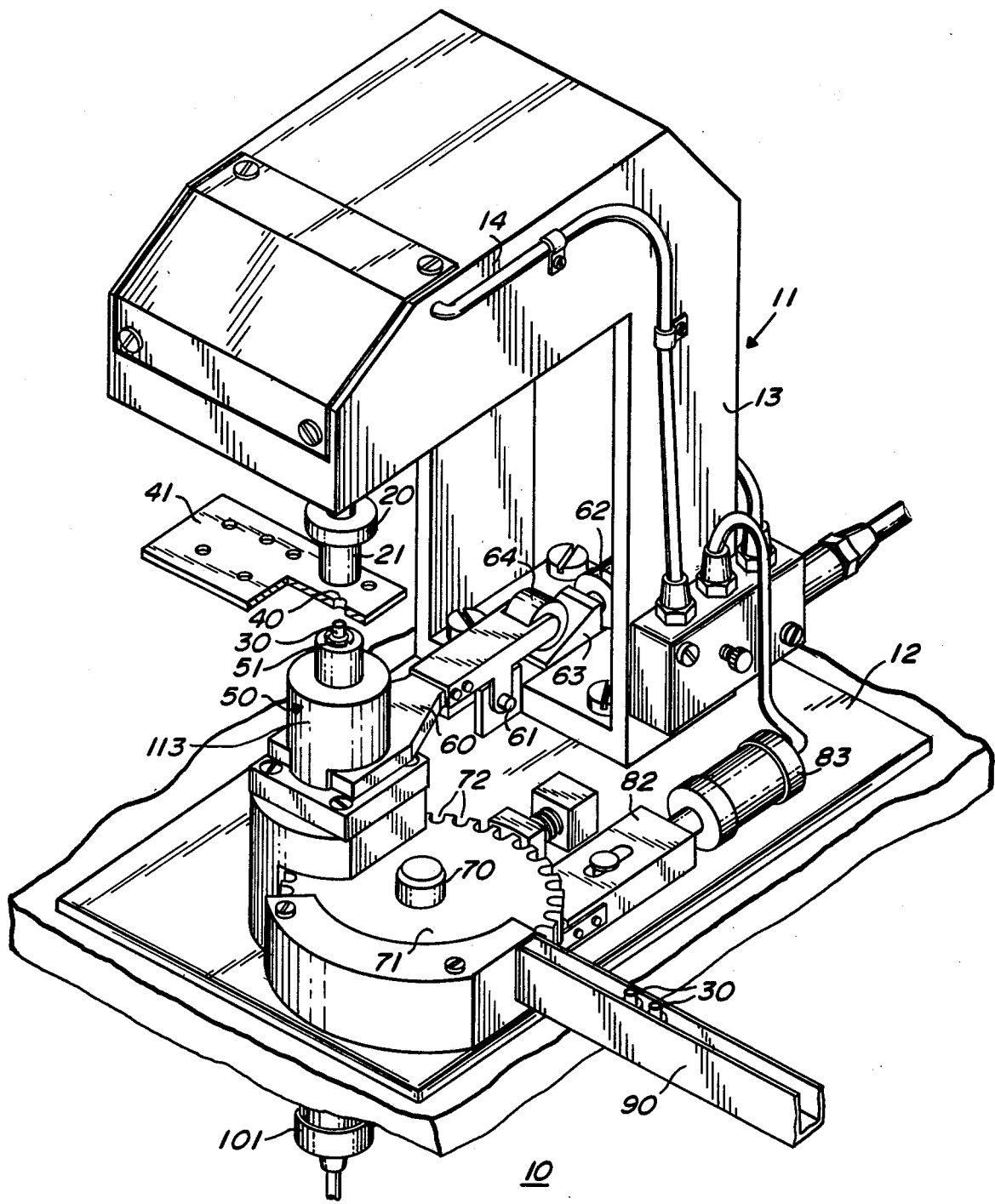

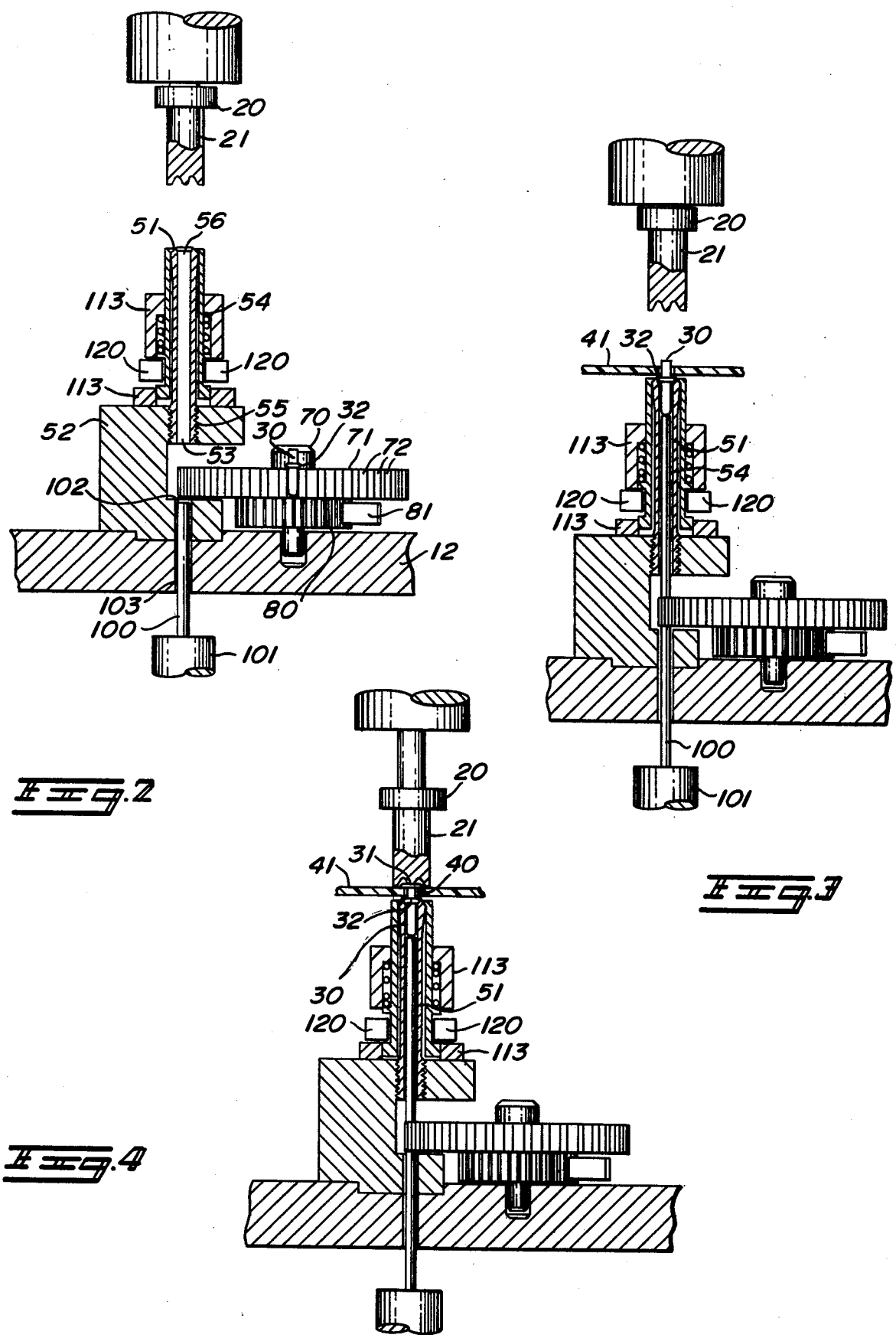

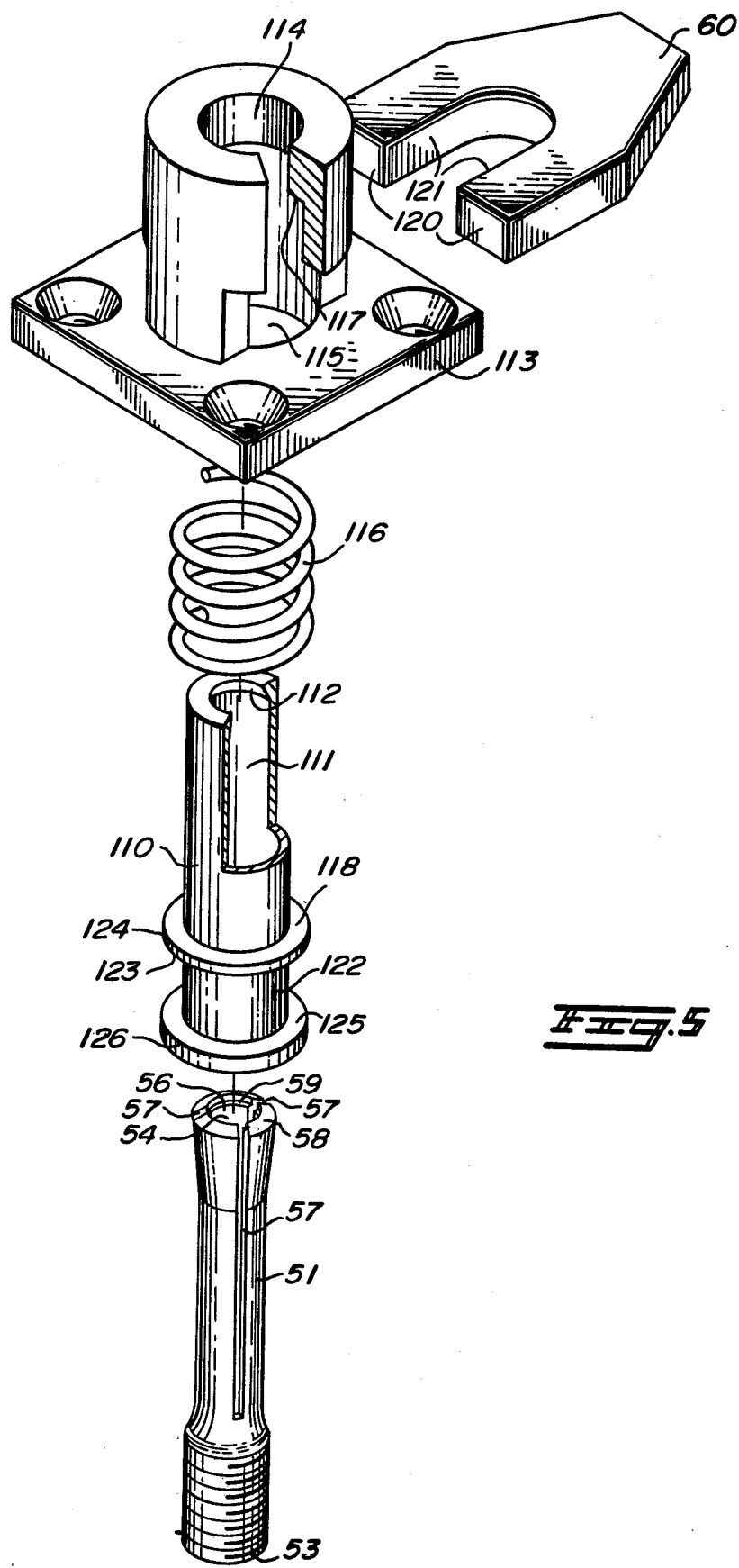

MECHANISM FOR FEEDING AND INSERTING PINS INTO CIRCUIT BOARD

BACKGROUND OF THE INVENTION

1. Field of the Invention

This invention generally relates to mechanisms and methods for feeding pins. More particularly, this invention relates to methods and mechanisms for feeding and holding pins for use with electrical circuit board assemblies. The subject matter of the present invention finds application in production assembly lines where a large number of pins are to be assembled to electrical circuit boards using automatic or semi-automatic production machinery and assembly techniques. Prior to this invention, several methods of holding pins prior to insertion in a circuit board were known. One of these methods involves the use of a hand-operated press for staking pins into a circuit board. A lower die containing a bore is utilized to hold a manually inserted pin in position while a circuit board containing a hole is placed over the pin and the pin is staked in position using a punch connected to a manually or pneumatically operated ram. Manual insertion of the pins into the die is a time consuming, inefficient operation. In many cases such a manually operated and loaded system must be used for repair work because semiautomatically loading machines do not allow rework on a circuit board because other pins already inserted into the circuit board interfere with the feed mechanisms of such machines.

Another type of prior art pin holder contains a feed mechanism located in the same plane as the apparatus for holding the pin in position. Such feed mechanisms include a housing containing a slot for guiding a pin from a remote feed point to the final holding point. A push rod pushes the pin from the feed point through the slot to the final holding position where a pair of jaws holds the pin in position. The feed rod is required to push the pin through the slot a considerable distance, causing a skilled operator to wait while a pin is pushed into position. Another disadvantage of this system is that the feed mechanism lies in the same plane as the holding jaws so that a predetermined sequence of pin insertions must be followed in order that pins already inserted in a circuit board do not interfer with the guide slot housing. Reworking circuit boards with components already inserted causes the already inserted components to interfere with the guide slot housing, requiring an insertion of reworked terminals on a manually operated press as mentioned previously.

Consequently, the holding of pins in holes and circuit boards has presented problems which are expensive and time consuming in a automatic or semi-automatic production assembly environment.

SUMMARY OF THE INVENTION

Accordingly, an object of this invention is to provide an improved apparatus and method for feeding and holding pins for insertion in electrical circuit boards.

Another object of this invention is to provide a mechanism by which pins may be inserted in a circuit board in a variety of locations.

Another object of this invention is to provide a semi-automatic, sequential feed mechanism having a low duty cycle for high production rates.

Another object of this invention is to provide a feed mechanism for pins which includes an integral clamping structure to hold said pins.

Another object of this invention is to provide a method for sequentially feeding and holding pins for high-speed semi-automatic production assembly.

Another object of this invention is to provide a method for holding a pin while a work piece is positioned over said pin and for holding said pin while a portion of said pin is being deformed with a punch to lock said pin in place.

Briefly, the invention consists of a sequential magazine feed and holding apparatus for pins to be inserted in a work piece, such as an electrical circuit board. A collet means is provided having a longitudinal bore extending therethrough from a feed end to a holding end for receiving, transporting, and holding a pin. A feed means for sequentially feeding a pin into the feed end of said collet bore and a transport means for transporting the pin from the feed end to the holding end of said collet are provided along with a holding means for predeterminedly holding the pin in the holding end of said collet. The holding end of the collet has at least one longitudinal slot to permit variations in the bore cross sectional area. A push rod pushes the pin into position through the bore of the collet. The pin is clamped into position in the collet by means of a sleeve around said collet, said sleeve and said collet having portions which cooperate to clamp said pin when said collet and said sleeve are moved longitudinally with respect to each other. The magazine feed means includes an indexable disc having peripheral cutouts for receiving and containing the pins urged therein. Said disc is indexed to sequentially bring said disc cutouts into alignment with the feed end of the collet bore. The disc may be indexed, for example by a pawl and ratchet arrangement. A pin may be attached to a work piece, such as a circuit board, by holding the pin within the holding end of the collet as described and having a punch coaxial with said collet bore to deform a deformable portion of said pins thereby locking said pin in the work piece.

A method for sequentially feeding and holding pins is disclosed comprising the steps of sequentially feeding a pin into position near a feed end of a collet means having a bore extending therethrough from the feed end to a holding end and transporting a pin from the feed end to the holding end. The pin is held in the holding end of said collet means bore and a further step of deforming said pin to attach said pin to a work piece may be performed with a punch means coaxial with said collet bore.

BRIEF DESCRIPTION OF THE DRAWINGS

For a more complete understanding of the invention, reference is made to the drawings, in which:

FIG. 1 is a perspective view of a sequential magazine feed and holding apparatus for pins according to the present invention;

FIG. 2 is a partially cross sectional elevation view of a portion of the apparatus;

FIG. 3 is a partially cross sectional elevation view showing a pin positioned and held according to the invention;

FIG. 4 is a partially cross sectional elevation view showing a pin inserted and fastened to a work piece;

FIG. 5 is an exploded view of a collet and sleeve assembly according to the invention.

DESCRIPTION OF THE PREFERRED EMBODIMENT

The sequential magazine feed and holding apparatus for pins described in this embodiment is a machine arranged for holding and inserting pins in electrical circuit boards and the like. It should be noted that the present invention is also adaptable for use with other types of pins. The method described herein also is adapted for use with other types of pins. Referring to FIG. 1 of the drawings, a sequential magazine feed and holding apparatus 10 for pins is shown having a support frame 11. The frame includes a base member 12 and an upright support member 13 having an overhanging portion 14.

Mounted on the overhanging portion 14 of the frame 11 is punch holder 20 containing a punch 21. The punch holder 20 is movable in a vertical direction under the control of a pneumatic drive means (not shown) as is well-known in the art.

As shown in FIG. 4, punch 21 performs an operation on a pin 30 projecting through a hole 40 in a circuit board 41. Such an operation might be, for example, a rolling operation on an end of pin 30 such as to form a lip for fastening the pin 30 to the circuit board 41 as is well-known in the art.

Pin 30 is held by a holding assembly 50 mounted to the base member 12 as shown in FIG. 1.

An actuating fork member 60 is pivotable about pivot pin 61 in response to a force exerted by air cylinder 62 (partially shown) against a wedge 63, exerting force against a roller end 64 of the actuating fork member 60. The force exerted by air cylinder 62 in a horizontal direction is thereby converted to a vertical force acting upon the holding assembly 50.

Pin 30 is contained within the holding assembly 50 by means of a collet 51 as will be described hereinbelow.

Portions of the collet 51 holding end 56 extend upwardly from the holding assembly 50, providing clearance for previously assembled pins.

A vertical shaft 70 is affixed to the base number 12 and provides support for a disc member 71 which is coaxial with and connected to a ratchet gear 80 (shown in FIG. 2). Spaced around the periphery of disc member 71 are a series of cutouts 72 dimensioned to contain pins 30.

The disc member 71 and the ratchet gear 80 are locked together so that when the ratchet gear 80 is indexed by a pawl 81 attached to an end of a carrier 82 driven by an air cylinder 83, the cutouts 72 containing pins 30 are positioned in a predetermined manner beneath the holding assembly 50.

Pins 30 are fed to the cutouts 72 sequentially from the feed track 90 which contains pins from a vibratory hopper (not shown) as is well-known in the art.

FIG. 3 shows that pin 30 is urged through the collet 51 contained by the holding assembly 50 by means of a rod 100 actuated by air cylinder 101 transporting pin 30 to the top of collet 51.

FIGS. 2, 3, and 4 show in sequence the operation of the apparatus. In FIG. 2 is shown a pin 30 being contained within a cutout 72 in the disc member 71. In response to movements of the pawl 81 against the teeth of ratchet gear 80, the disc member 71 is rotated such that a cutout containing a pin 30 is aligned opposite end 102 of rod 100. Rod 100 is guided through an aperature 103 extending through base member 12 and the holding assembly base 52. The end 102 of rod 100 pushes pin 30 towards the feed end 53 of collet 51, collet 51 containing a bore 54 extending longitudinally through said collet. Collet 51 has external threads 55 which secure the collet to the holding assembly base 52.

FIG. 5 shows the collet 51 in more detail. Bore 54 extends down the longitudinal axis of the collet 51 from the feed end 53 to a holding end 56. Longitudinal slots 57 in the holding end 56 of the collet 51 allow the cross sectional area of the bore 54 in the vicinity of the holding end 56 to be reduced. Collet 51 is formed at the holding end 56 to have an external profile of varying cross section and includes a tapered portion 58 providing a cam surface as described herein below.

The holding end of collet 51 also contains a recessed portion 59 in which rests a shoulder portion 32 of pin 30, the shoulder having a larger diameter that the rest of the pin. In operation, the end 102 of rod 100 pushes the pin 30 through the bore 54 of collet 51 from the feed end 53 to the holding end 56. The shoulder 32 of a pin 30 comes to rest within the recessed portion 59.

Sleeve 110 has an interior bore 111 the diameter of which matches the outside diameter of collet 51. The interior bore 111 of sleeve 110 has a tapered wall portion 112 near the upper end of the bore upon which rests the tapered portion 58 of collet 51. As the sleeve 110 moves longitudinally with respect to the collet 51, the tapered portion 112 of the sleeve 110 and the tapered portion 58 of collet 51 interact to determine the diameter of the holding end of the collect 51.

Affixed to holding assembly base 52 is a locking sleeve holder 113 which has a central bore 114 for guiding the locking sleeve 110. Contained within an aperture 115 within the central bore 114 of the locking sleeve holder 113 is a helical spring 116 which surrounds the outer diameter of the upper portion of the locking sleeve 110. The spring 116 is under compression and exerts a force against surface 117 of the locking sleeve holder 113 and against surface 118 of the locking sleeve 110, causing the sleeve 110 to be biased downwardly and thereby tending to reduce the area of the holding end of collet 51.

As pin 30 is pushed through the bore 54 of collet 51, the shoulder 32 of the pin rides along the wall of the bore. A slight, constant drag force is exerted on the pin 30 due to the biasing action of spring 116 as the pin 30 is pushed through the collet by the push rod 100, preventing the pin 30 from flying away from the holding position when the push rod 100 suddenly stops at the end of its travel.

The actuating fork member 60 has furcated arms 120 the interior surfaces 121 of which ride over the surface 122 of the locking sleeve 110. Forces exerted against surface 123 of the top projection 124 of locking sleeve 110 and the surface 125 of the bottom projection 126 of the locking sleeve 110 cause relative motion between the tapered portion 58 of the collet 51 and the tapered portion 112 of the interior bore 111 of the locking sleeve 110 causing the cross sectional area of the holding end of collet 51 to change dimension.

When the furcated arms 120 of fork member 60 are in the down position as shown in FIG. 4, pin 30 is clamped within the holding end 56 of the collet 51. Pin 30 extends through a hole 40 in a circuit board 41. Since the fork member 60 is in the down position, pin 30 is clamped in position by the holding end 56 of collet 51 as described hereinabove. A lip 31 is rolled over on an end of pin 30 by punch 21. The shoulder 32 of pin 30 together with rolled over lip 31 on pin 30 fix pin 30 to the circuit board 41 as is well-known in the art.

It should be understood that the principles of the present invention apply to pins of various configuration for use with work pieces other than electrical circuit boards or the like.

The steps in carrying out the method of the present invention are illustrated in FIGS. 2, 3 and 4. Pin 30, as shown in FIG. 2, is sequentially fed into position near the feed end 53 of collet 51, said collet 51 having a bore 54 extending therethrough from the feed end 53 to the holding end 56.

FIG. 3 shows pin 30 having been transported through the bore 54 of the collet 51 and positioned near the holding end 56 of the collet 51. The furcated arms 120 of the actuating fork member 60 are in the up position in FIG. 3 so that the pin 30 is not clamped but is held at holding end 56 of collet 51 due to the biasing action of spring 116 against the locking sleeve 110.

FIG. 4 shows the furcated arms 120 of the actuating fork members 60 in the down position, thereby clamping pin 30 in the holding end 56 of collet 51. Circuit board 41 having hole 40 is positioned over the end of pin 30 with the end of pin 30 extending through hole 40 and has been rolled over into a lip 31 by the punch 21. This step securely fastens pin 30 to the circuit board 41 by means of shoulder 32 and the lip 31 on the pin 30.

While a particular embodiment and method of the invention has been shown and described, it should be understood that the invention is not limited thereto since many modifications may be made. It is therefore contemplated to cover by the present application any and all such modifications that fall within the true spirit and scope of the basic underlying principles disclosed and claimed herein.

What is claimed is:

1. A sequential magazine feed and holding apparatus for pins comprising:
    a collet means having a longitudinal bore extending therethrough from a feed end to a holding end for receiving, transporting and holding a pin;
    magazine feed means for sequentially feeding the pin into a position near the receiving end of said collet means bore;
    transport means for transporting the pin from the feed end to the holding end of said collet means bore; and
    holding means for predeterminedly holding the pin in the holding end of said collet means bore.

2. The apparatus of claim 1 in which the collet means comprises a collet having a holding end with at least one longitudinal slot to permit changes in the bore cross sectional area dimension to allow passage of a pin therethrough and to clamp a pin in a holding position.

3. The apparatus of claim 1 in which the transport means comprises a push rod coaxial with said longitudinal bore.

4. The apparatus of claim 1 in which the holding means comprises a sleeve around the holding end of said collet means, said sleeve having a predetermined inner diameter cross sectional area dimensioned to cooperate with a predetermined external diameter cross sectional area of said collet to clamp said pin when said collet and said sleeve move longitudinally with respect to each other.

5. The apparatus of claim 4 further comprising the sleeve having external slots perpendicular to a sleeve actuating clamp having a fork-shape portion, the furcations of said clamp engaging the slots of said sleeve so that the sleeve may be moved relative to the collet.

6. The apparatus of claim 1 in which the magazine feed means comprises:
    a means for predeterminedly orienting and one-by-one urging the pins;
    an indexable disc having peripheral cutouts thereon adapted to receive and contain the pins urged therein by the orienting means; and
    indexing means coupled to said indexable disc for sequentially bringing said disc cutouts in alignment with the feed end of said collet bore.

7. The apparatus of claim 6 in which the indexing means comprises:
    a ratchet attached to said disc;
    a pawl which cooperates with said ratchet; and pawl actuating means for sequentially stepping said pawl to provide predetermined positioning of said disc cutouts.

8. The apparatus of claim 1 adapted to feed and hold pins having portions insertable in circuit boards and having deformable portions which may be deformed to provide engagement with said circuit board further comprising:
    a punch coaxial with said collet bore, said punch adapted to deform said deformable portions of said pins, locking said pins in said circuit boards.

* * * * *